United States Patent
Mair et al.

(10) Patent No.: US 8,564,351 B2
(45) Date of Patent: Oct. 22, 2013

(54) CLOCK PHASE COMPENSATION FOR ADJUSTED VOLTAGE CIRCUITS

(75) Inventors: Hugh Thomas Mair, Fairview, TX (US); Jie Gu, San Diego, CA (US); Gordon Gammie, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 22 days.

(21) Appl. No.: 13/195,020

(22) Filed: Aug. 1, 2011

(65) Prior Publication Data

US 2013/0033295 A1    Feb. 7, 2013

(51) Int. Cl.
   *H03K 3/356* (2006.01)
(52) U.S. Cl.
   USPC ............................................. 327/208
(58) Field of Classification Search
   USPC ................. 327/199–203, 208, 210–215, 218
   See application file for complete search history.

(56) References Cited

U.S. PATENT DOCUMENTS 7,484,149 B2 *   1/2009   Lackey .................... 714/726

* cited by examiner

*Primary Examiner* — Lincoln Donovan
*Assistant Examiner* — Sibin Chen
(74) *Attorney, Agent, or Firm* — Wade J. Brady, III; Frederick J. Telecky, Jr.

(57) ABSTRACT

Clock phases of clock signals in a dual clock tree are adjusted to compensate for variances in propagation delays of buffers in the clock tree. A first input clock and a second input clock are generated with the second input clock having a phase that is programmably shifted relative to the first input clock when the system is operating at a lowered operating voltage or different temperature, for example. The first and second input clocks are coupled to a dually clocked flip flop, each having a primary latch and a secondary latch. A composite clock signal is generated in response to the first input clock and the second input clock. For example, a first signal is latched in the primary latch in response to the composite clock signal and a second signal is latched in the secondary latch in response to the first input clock signal.

19 Claims, 5 Drawing Sheets

CLOCK PHASE COMPENSATION FOR ADJUSTED VOLTAGE CIRCUITS

BACKGROUND

Clocking is implemented in highly integrated system-on-chips (SoCs) using a clock tree that is automatically synthesized using engineering design aid (AID) tools. The clock is propagated using a single path along which many buffers are used to couple the clock signal from the point of generation to various destinations (e.g., "leaf" cells). However, the buffers used to build this tree have varying degrees of delay, which causes phase differences in the clock signal at different points of the destinations. The varying degrees of delay are compounded because different branches of the clock trees have different degrees of delay. Further, the degrees of delay can vary in a nonlinear fashion as a function of voltage.

SUMMARY

The problems noted above are solved in large by adjusting the phase of a clock when an operating voltage is decreased (to save power, for example). As disclosed herein, clock phases of a clock signal in a dual clock tree are adjusted to compensate for variances in propagation delays of buffers in the clock tree. A first input clock and a second input clock are generated with the second input clock having a phase that is programmably shifted relative to the first input clock when the system is operating at a lowered operating voltage or different temperature(s), for example. The first and second input clocks are coupled to dually clocked flip flops each having a primary latch and a secondary latch. A composite clock signal is generated in response to the first input clock and the second input clock. For example, a first signal is latched in the primary latch in response to the composite clock signal and a second signal is latched in the secondary latch in response to the first input clock signal.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular system components. As one skilled in the art will appreciate, various names can be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . " Also, the terms "coupled to" or "couples with" (and the like) are intended to describe either an indirect or direct electrical connection. Thus, if a first device couples to a second device, that connection can be through a direct electrical connection, or through an indirect electrical connection via other devices and connections.

Figure 1:
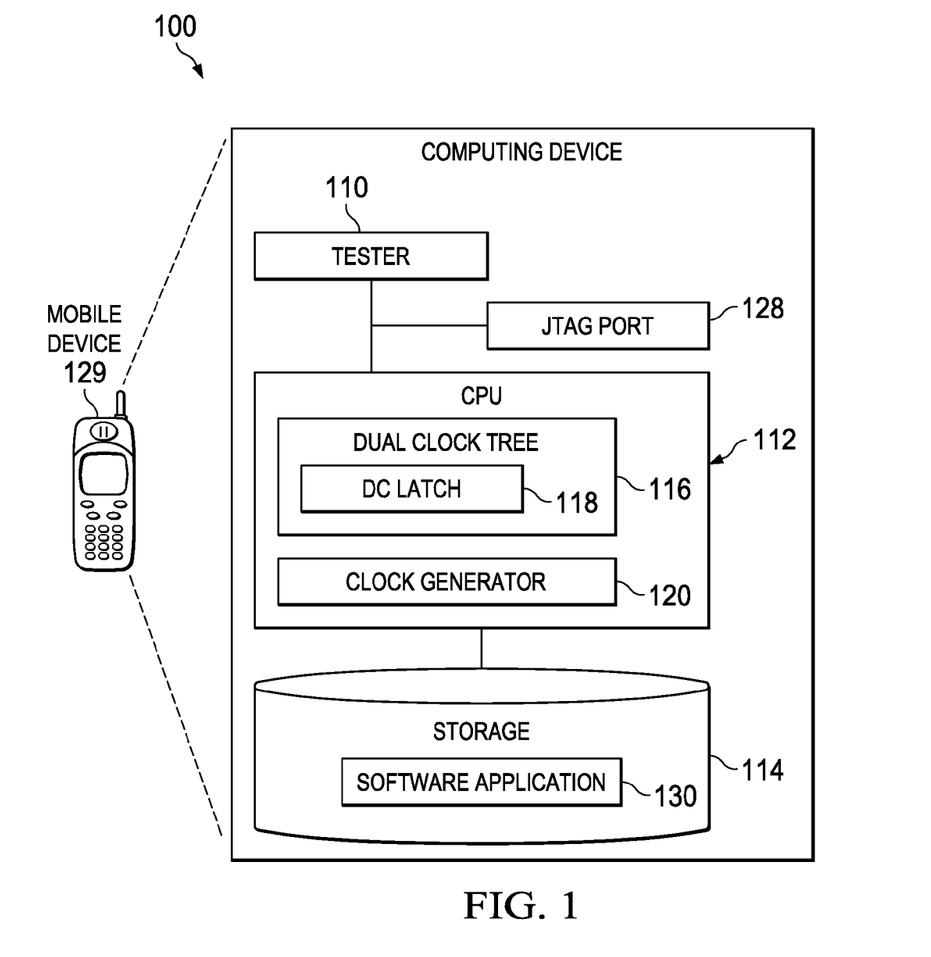
FIG. 1 shows an illustrative computing device 100 in accordance with embodiments of the disclosure.

FIG. 1 shows an illustrative computing device 100 in accordance with embodiments of the disclosure. The computing device 100 is, or is incorporated into, a mobile communication device 129, such as a mobile phone, a personal digital assistant (e.g., a BLACKBERRY® device), a personal computer, automotive electronics, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as RAM, flash memory, or disk storage) stores one or more software applications 130 (e.g., embedded applications) that, when executed by the CPU 112, perform any suitable function associated with the computing device 100. The tester 110 comprises logic that supports testing and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 typically comprises memory and logic which store information frequently accessed from the storage 114. Various subsystems (such as the CPU 112 and the storage 114) of the computing device 100 include dually clocked flip flops (e.g., D.C. Latches) 118, which are used during the execution the software application 130. The various subsystems often are required to operate at different voltages such as voltages encountered when operating at a normal (or "high") voltage mode (such as when being operated by a user) and a low voltage mode (such as when in a standby mode).

CPU 112 includes (and/or is coupled to) a clock generator 120 that is programmable to generate a dual clock with a programmable phase difference in accordance with the present disclosure. The clock generator 120 is coupled to a dual clock tree 116, which drives dually clocked flip flops 118 at ends of the branches of the clock tree 116. The dual clock tree 116 includes cells (such as inverters used as drivers and buffers) that are repeated amongst various branches of the tree (see, FIG. 5, for example).

The dual clock tree 116 is often synthesized in design by using engineering design analysis (EDA) tools to insert multiple instances of a cell (e.g., a buffer) to couple a clock signal from the clock generator 120 to the "leaf cells" such as the dually clocked flip flops 118 (at the ends of branches of the dual clock tree). Each of the instances has a variable signal propagation delay (due to manufacturing tolerances, for example), where the signal propagation delay of each instance is often different from the signal propagation delays of other instances (despite being different instances of the same cell). Thus, the propagation delay can vary from branch to branch. The variations in the propagation delay are substantial when the variations jeopardize clocking of data that is passed between branches of the clock tree, for example.

The signal propagation delay also varies (in a non-linear fashion, for example) as a function of the operating voltage, which causes phase differences in the propagated clock signals. For example, as the operating voltage decreases, the phase difference (expressed as a percentage of the signal propagation delay) increases relatively rapidly, and results in errors in data propagation (such as when setup and hold times are violated). Thus, the resulting phase errors provide a lower limit to reductions in operating voltages.

Conventional design methodologies are limited with regards to providing optimal solutions for minimizing effects of such phase errors (and/or "clock skew"). Providing optimal solutions for minimizing the effects of phase errors is difficult because the signal propagation delay of each instance (e.g., buffer) has a significant random variation that is not well predicted by current EDA tools. (This problem becomes especially more problematic as the variances increase non-linearly at increasingly lower voltages.) Merely using buffers designed for insertion at low voltages does not provide an optimal solution because the low-voltage buffers introduce larger performance penalties when operating at higher operating voltages.

Disclosed herein are techniques for a register and clocking scheme that operates in a single clock mode when operating in a high voltage mode, and operates in a dual-phase clocking mode (with at least two-related clock signals) when operating in a low voltage mode. In dual-clock mode, the phase difference between the two signals is programmed such that it is larger than the delay variation in a clock tree. This provides robust clocking when operating at low voltages without the need for additional hold buffering that entails performance penalties. Additionally, modifying a dual redundant latch to use the dual-phase clocking (as disclosed herein) can be accomplished with the addition of as few as two transistors per latch, which minimizes layout and power requirements.

Figure 2:
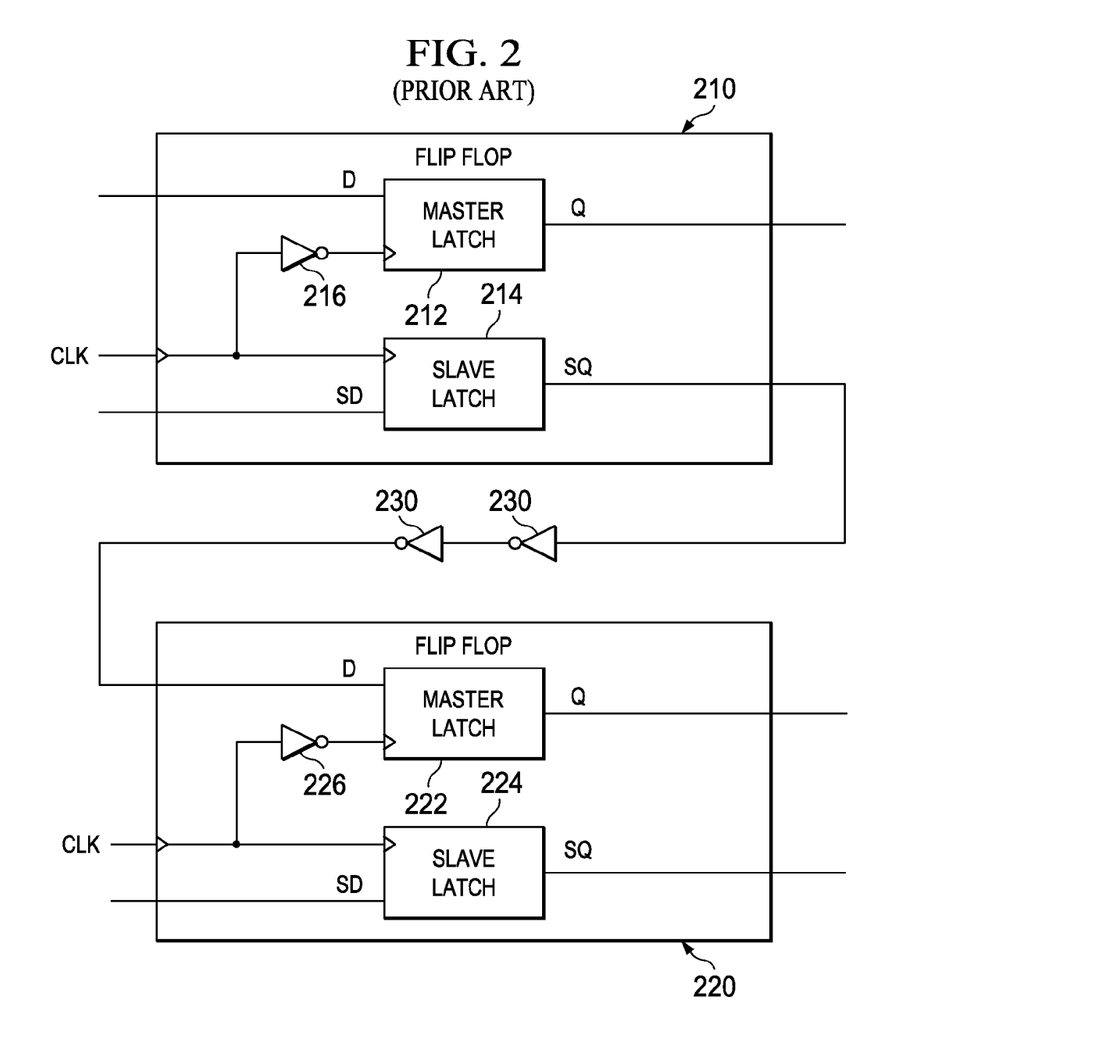
FIG. 2 is a schematic diagram illustrating a conventional dual redundant latch.

FIG. 2 is a schematic diagram illustrating a conventional dual redundant latch. Flip flop 210 receives a first data signal, which is coupled to a D input of master latch 212. A clock signal (CLK) is received by flip flop 210, inverted by inverter 216, and used to clock master latch 212 to latch the D input of master latch 212. The state of the D input is latched during an active transition (such as a positive-going transition) of the inverted clock signal such that the latched logic state is presented at output Q. A second data signal is also received by flip flop 210 and is coupled to an SD input of slave latch 214. The clock signal (CLK) received by flip flop 210 is used to clock slave latch 214 to latch the state of the SD input of master latch 214. The logic state of the SD input is latched during an active transition (such as a positive-going transition) of the (non-inverted) clock signal and the latched logic state is presented at output SQ. Thus, master latch 212 and slave latch 214 are effectively clocked by opposing phases of the received clock signal.

Flip flop 220 is similarly arranged. Flip flop 220 receives a first data signal, which is coupled to a D input of master latch 222. Clock signal CLK is received by flip flop 220, inverted by inverter 226, and used to clock master latch 222 to latch the D input of master latch 222. The state of the D input is latched during an active transition of the inverted clock signal such that the latched logic state is presented at output Q. A second data signal is also received by flip flop 220 and is coupled to an SD input of slave latch 224. The clock signal (CLK) received by flip flop 220 is used to clock slave latch 224 to latch the state of the SD input of master latch 224. The logic state of the SD input is latched during an active transition (such as a positive-going transition) of the (non-inverted) clock signal and the latched logic state is presented at output SQ. Thus, master latch 222 and slave latch 224 are effectively clocked by opposing phases of the received clock signal.

In operation, flip flops 210 and 220 are often arranged, such that the output SQ of slave latch 214 (of flip flop 210) is coupled (via inverters 230) to the D input of the master latch 222 (of flip flop 220). A timing criticality for this arrangement is encountered when a signal is allowed to propagate through slave latch 214 (and inverters 230) before master latch 222 finishes latching the previous logic state from slave latch 214. This timing criticality is compromised by delay variations in the clock tree for signals CLK and CLK' (which may be derived from different branches in a clock tree). The delay variations vary exponentially with the voltage threshold mismatches of circuits in the clock tree. At lower operating voltages, the mismatches become exponentially greater, which leads to substantial clock skew between different branches of a clock tree that can result in invalid data being latched.

Figure 3:
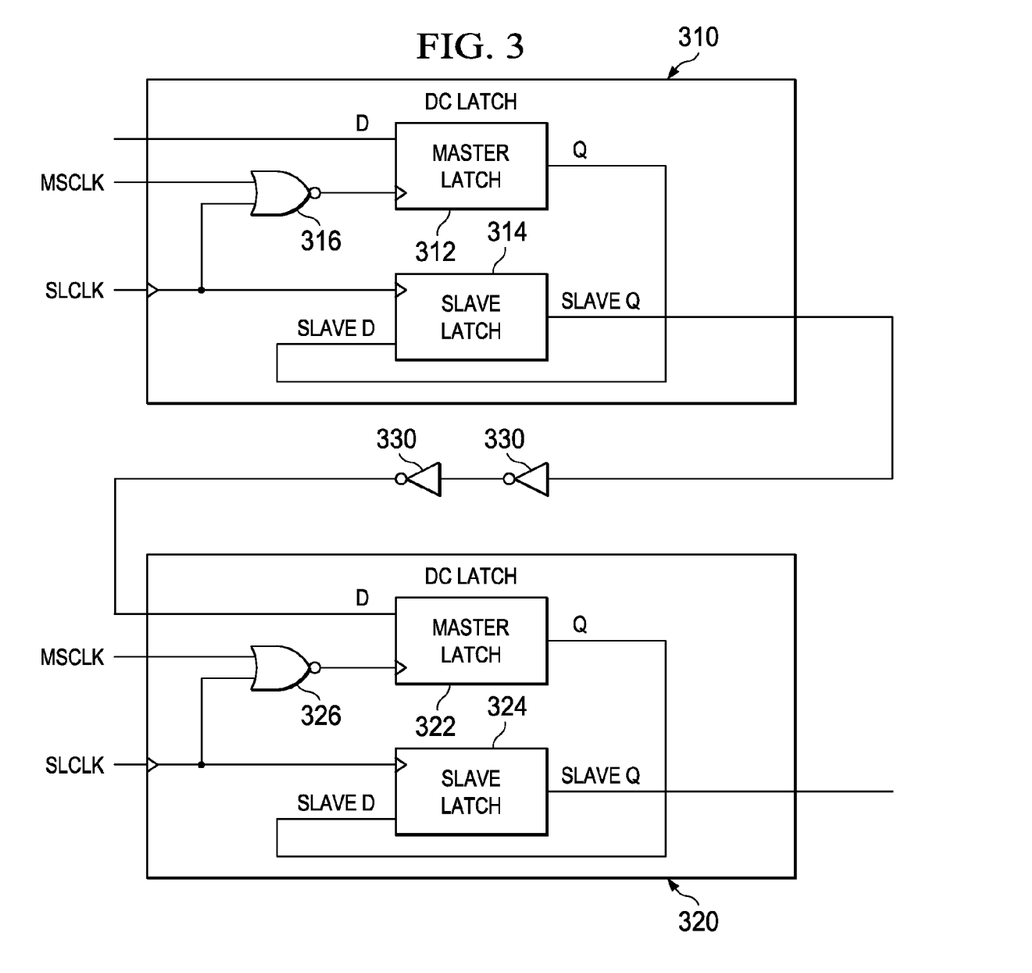
FIG. 3 is a schematic diagram illustrating a dually clocked redundant latch in accordance with embodiments of the disclosure.

FIG. 3 is a schematic diagram illustrating a dually clocked redundant latch in accordance with embodiments of the disclosure. Flip flop 310 receives a primary data signal, which is coupled to a D input of master latch 312. A first clock signal (SLCLK) is received by flip flop 310 and is coupled to a first input of composite clock generator 316. A second clock signal (MSCLK) is received by flip flop 310 and is coupled to a second input of composite clock generator 316. Composite clock generator 316 generates a composite clock that is used to latch the D input of master latch 312. Composite clock generator 316 in an embodiment is a NOR (negated logical OR operation) gate that generates the composite clock signal in accordance with the waveforms of MSCLK and SLCLK as described below with reference to FIG. 6.

The state of the D input of master latch 312 is latched during an active transition of the composite clock signal such that the latched logic state is presented at output Q. Being generated in response to MSCLK and SLCLK in an embodiment, the composite clock signal is a periodic (e.g., repeating) waveform having two transitions per clock period. A first periodic transition of one clock period of the composite clock signal (such as the positive-going transition) is used as a primary latch signal to latch the primary input signal every clock cycle when the first periodic transition of the composite clock signal occurs, for example.

A secondary data signal is also received by flip flop 310 and is coupled to an SD input of slave latch 314. The first clock signal (SLCLK) received by flip flop 310 is used as a secondary latch signal to clock slave latch 314 to latch the state of the SD input of master latch 314. The logic state of the SD input is latched during an active transition (such as a positive-going transition) of the MSCLK signal such that the latched logic state is presented at output SQ. Thus, master latch 312 and slave latch 314 are independently clocked within each clock period of MSCLK and SLCLK.

Flip flop 320 receives a primary data signal, which is coupled to a D input of master latch 322. A first clock signal (SLCLK) is received by flip flop 320 and is coupled to a first input of composite clock generator 326. A second clock signal (MSCLK) is received by flip flop 320 and is coupled to a second input of composite clock generator 326. Composite clock generator 326 generates a composite clock that is used to latch the D input of master latch 322. The state of the D input of master latch 322 is latched during an active transition of the composite clock signal such that the latched logic state is presented at output Q.

A secondary data signal is also received by flip flop 320 and is coupled to an SD input of slave latch 324. The first clock signal (SLCLK) received by flip flop 320 is used to clock slave latch 324 to latch the state of the SD input of master latch 324. The logic state of the SD input is latched during an active transition of the MSCLK signal such that the latched logic state is presented at output SQ. Thus, master latch 322 and slave latch 324 are independently clocked within each clock period of MSCLK and SLCLK.

In operation, flip flops 310 and 320 are arranged (for example), such that the output SQ of slave latch 314 (of flip flop 310) is coupled (via inverters 330) to the D input of the master latch 322 (of flip flop 320). A timing criticality for this arrangement is encountered when a signal is allowed to propagate through slave latch 314 (and inverters 330) before master latch 322 finishes latching the previous logic state from slave latch 314. This timing criticality is compensated for using the independent clocking capability provided by the MSCLK signal. The MSCLK contains information for a selecting between a first (e.g. high voltage) operating mode and second (e.g. low voltage) operating mode, and also contains information for clocking master latches (e.g., 312 and 322) independently of slave latches (e.g., 314 and 324). For example, in one operating mode, the MSLCK remains at a DC (direct current) level, which saves power in CMOS (complementary metal-oxide-semiconductor) implementations. The generation of MSCLK is described below with reference to FIG. 4.

In an alternate embodiment, the composite clock generator 316 is coupled between SLCLK and the clock input of the slave latch 314 to generate the secondary latch signal used to latch the slave latch 314. The composite clock generator can also be used to generate the primary latch signal and/or the first input clock signal can be coupled as the primary latch signal to latch the primary latch 312. Various logical arrangements of the composite clock generator 316 are possible in view of the teachings disclosed herein.

Figure 4:
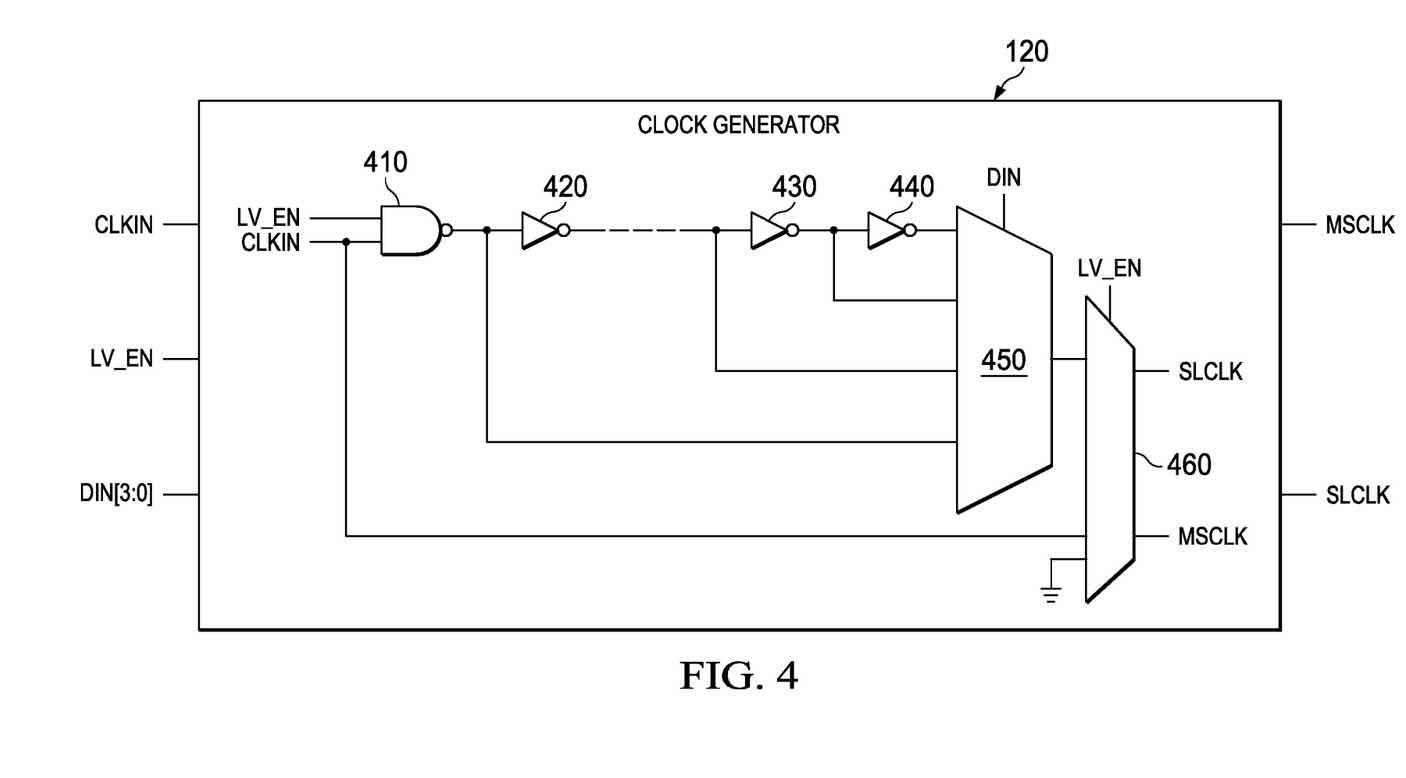
FIG. 4 is a schematic diagram illustrating a phase-programmable clock generator in accordance with embodiments of the disclosure.

FIG. 4 is a schematic diagram illustrating a phase-programmable clock generator in accordance with embodiments of the disclosure. The clock generator 120 is configured to generate dual phase clock signals with a programmable phase difference in accordance with the present disclosure. As shown in FIG. 1, the clock generator can be incorporated into the CPU 112 and coupled to a dual clock tree 116, which drives dually clocked flip flops 118 at various ends of the branches of the dual clock tree 116.

When the CPU 112 (for example) is operating at normal operating voltage, the clock generator 120 is configured to generate a first clock (e.g., a slave clock) for clocking the dually clocked flip flops 118. When the CPU 112 is operating at a lower operating voltage, the clock generator 120 is configured to generate a second clock (e.g., a master clock) also used for clocking the dually clocked flip flops 118. The clock generator 120 is configured to adjust the phase difference of the master clock to compensate for the variation of the propagation delay of the buffers in the dual clock tree 116 that occurs when the buffers (for example) are operating at a lower voltage (than the normal operating voltage). The compensation amount can be estimated during a design and/or measured after a device embodying the disclosed technology has been manufactured (e.g., formed in silicon).

As shown in FIG. 4, the clock generator 120 includes a low voltage selector gate 410, a delay line that is formed (for example) by inverters 420, 430, and 440 that are coupled in series, a delay selector 450, and a clock output buffer 460. (For simplicity, fewer delay line inverters are shown than could be used in an actual implementation, which would provide a greater amount of control for programming phase differences.) The clock generator is arranged to receive a reference clock (CLKIN), a low voltage selection signal (LV_EN), and a delay selection signal (DIN). The reference clock (CLKIN) is gated by the low voltage selector gate 410 in response to the state of the low voltage selection signal. When the low voltage selection signal is asserted, the reference clock is coupled to the delay line formed by the series of inverters 420, 430, and 440. The output of each inverter in the delay line forms a separate tap point in the delay line, from which signals having a different phase shift can be selected. More (or less) inverters can be used in the delay line to provide for greater (or lesser) degrees of phase shift of the delayed reference clock signal.

Each of the outputs of each inverter in the delay line is coupled to a separate selectable input of the delay selector 450. The delay selection signal is used to program the delay selector 450 by selecting an input that is coupled to one of taps of the delay line. For example, a two-bit wide delay section signal can be used to select from four separate taps provided at the input of the delay selector 450. The selected tap is coupled to the output of the delay selector 450.

The amount used to adjust the phase difference of the master clock can be determined by placing the circuit in a low voltage operating mode (which accentuates phase differences in the clock signal) and measuring performance of the dual clock tree 116. The performance of the dual clock tree 116 can be measured by, for example, by measuring the delay variation in a clock tree and/or and measuring phase differences between the first and the second input clock when the circuit for latching states is in a low voltage operating mode. (Alternatively or in conjunction with measurement of measuring phase differences between the first and the second input clock, phase differences can be measured with respect to either signal of the dual clock tree between differing branches of the clock tree.) One of the taps of the delay selector 450 can be selected such that the phase difference between the master and slave clocks is such that it is larger than the delay variation in a clock tree. The value for the digital command to select the appropriate tap can be stored by the CPU 112 and used to program the delay selector 450 during a boot routine, for example.

The clock output buffer 460 generates the dual clock that includes the slave clock and the master clock in response to the low voltage selection signal. The clock output buffer 460 adjusts the magnitude of voltages of the slave and master clocks in response to low voltage selection signal. The low voltage selection signal is also coupled to a voltage generator (not shown) for lowering the voltage between the power supply rails (e.g., VSS and VDD) of circuitry being clocked by the dual clock tree 116.

Figure 5:
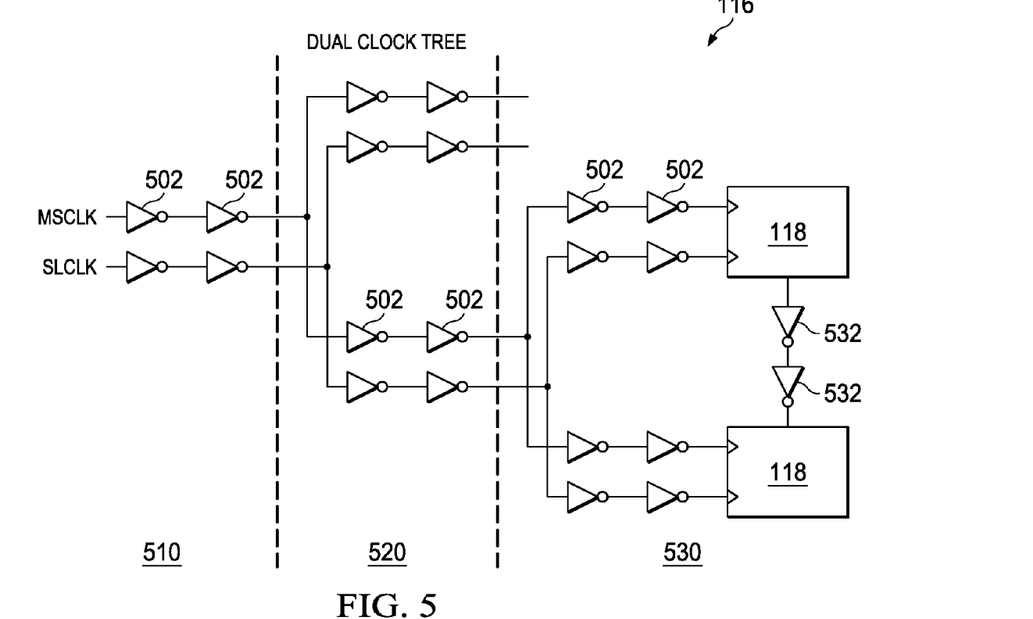
FIG. 5 is a schematic diagram illustrating a dual clock tree in accordance with embodiments of the disclosure.

FIG. 5 is a schematic diagram illustrating a dual clock tree in accordance with embodiments of the disclosure. The dual clock tree 116 in many embodiments is generated by an engineering design tool to avoid clock skew between leaf cells (such as the dually clocked flip flops 118) at various branches of the dual clock tree. The dual clock tree includes a dual clock, with one clock of the dual phase clock having a programmable phase shift for compensating for phase differences that occur in the inverters 502 of the dual clock tree. The phase differences for a given path in a clock tree typically grow larger as the operating voltage of the inverters 502 is lowered.

A (simplified) dual clock tree 116 is illustrated as having three levels (510, 520, and 530). The number of levels and the number of branches in each level is determined (at least) by the number of leaf cells having a clock signal coupled thereto, the drive strength and operating voltage of the buffers, and timing requirements of the system. For example, level 520 includes a branching of the dual clock tree 116 and level 530 also includes a branching of the dual clock tree 116.

As the operating voltage of the system in which the dual clock tree is instantiated (such as CPU 112) is lowered, the delay variations can vary appreciably. The delay variation introduced by each buffer in a path of the dual clock tree can accumulate to the point where a substantial clock skew exists between branches of the dual clock tree. A substantial clock skew exists, for example, when data flowing from a first branch of the dual clock tree 116 to a second branch via a data path established by inverters 532 does not meet the proper setup (and/or hold) requirements to be properly latched by circuitry (such as a dually clocked flip flop) of the second branch. In practice, the clock tree of MSCLK can have less buffers (than the clock tree of SLCLK) because (in accordance with the present disclosure) a phase of a transition of one of the clocks (such as the master clock) of the dual clock tree is programmably adjusted (e.g., phase shifted) in clock generator 120 to minimize clock skew between latches of different branches of the clock tree.

Figure 6:
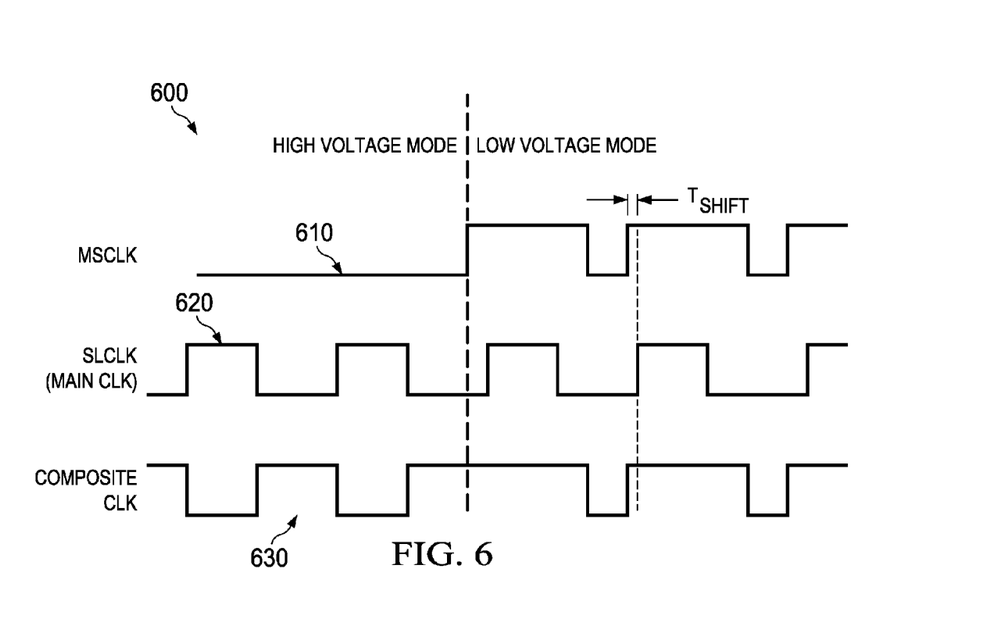
FIG. 6 is a timing diagram illustrating waveforms of the dual clock tree in accordance with embodiments of the present disclosure.

FIG. 6 is a timing diagram illustrating waveforms of the dual clock tree in accordance with embodiments of the present disclosure. Waveform diagram 600 includes the master clock (MSCLK) 610, the slave clock (SLCK) 620, and the composite clock (COMPOSITE CLK). In "high" voltage mode (such as a "normal" operating mode), the master clock remains inhibited (e.g., low), while the slave clock (used as the "main" clock) is used to clock (for example) the dually clocked flip flops 118. In a "low" voltage mode (such as when circuitry is operated at lower voltages to save power), both the master clock 610 and the slave clock 620 are activated. (The operation of the clocks in a dually clocked flip flop 118 is discussed above with respect to FIG. 3).

As illustrated, the duty cycle of the master clock 610 is different from the duty cycle of the slave clock 620. For example, the master clock 610 has both a falling edge (e.g., a downward transition from high to low) and a rising edge (an upward transition from low to high), both of which occur when the slave clock 620 is low. A phase difference ($T_{SHIFT}$) exists between the upward transitions of the master clock 610 and the slave clock 620. The upward transition of the master clock 610 can be adjusted (for example, by clock generator 120) so that the phase difference ($T_{SHIFT}$) is greater than the delay variation of the dual clock tree. Empirically measuring the delay variation in a low voltage operating mode eases design considerations such as minimum delay analysis and reduced system performance resulting from additional hold buffering (used to meet setup and hold requirements at low voltages, for example). As also discussed above with reference to FIG. 3, the illustrated composite clock signal 630 is generated by a NOR gate in response to the master clock 610 and slave clock 620.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A circuit for latching logic states, comprising:
a primary latch arranged to latch a primary input signal in response to a primary latch clock signal, and to generate a primary output signal in response to the latched primary input signal;
a secondary latch arranged to latch the primary output signal in response to a secondary latch clock signal, and to generate a secondary output signal in response to the latched primary output signal; and
a composite clock generator that is arranged to generate a composite clock signal in response to a first input clock signal and a second input clock signal, wherein the primary latch clock signal is generated in response to the composite clock signal and the secondary latch clock signal is coupled to or generated in response to the second input clock signal, or the primary latch clock signal is coupled to or generated in response to the first input clock signal and the secondary latch signal is generated in response to the composite clock signal;
wherein the first input clock is received at a first clock input that is coupled to a first clock tree, and the second input clock is received at a second clock input that is coupled to a second clock tree, the first clock tree including buffers exclusive of the second clock tree, and the second clock tree including buffers exclusive of the first clock tree.

2. A circuit for latching logic states, comprising:
a primary latch arranged to latch a primary input signal in response to a primary latch clock signal, and to generate a primary output signal in response to the latched primary input signal;
a secondary latch arranged to latch the primary output signal in response to a secondary latch clock signal, and to generate a secondary output signal in response to the latched primary output signal; and
a composite clock generator that is arranged to generate a composite clock signal in response to a first input clock signal and a second input clock signal, wherein the primary latch clock signal is generated in response to the composite clock signal and the secondary latch clock signal is coupled to or generated in response to the second input clock signal, or the primary latch clock signal is coupled to or generated in response to the first input clock signal and the secondary latch signal is generated in response to the composite clock signal;
wherein the composite clock generator is configured to generate the composite clock signal as having a duty cycle that is the same as the duty cycle of the first input clock when the circuit for latching states is in a first operating mode, and to generate the composite clock signal as having a duty cycle that is determined in response to the first input clock and the second input clock when the circuit for latching states is in a second operating mode.

3. The circuit of claim 2, wherein the first operating mode is a normal voltage operating mode and wherein the second operating mode is a low voltage operating mode.

4. The circuit of claim 2, further comprising a clock generator in the same substrate of the composite clock generator.

5. The circuit of claim 4, wherein the clock generator is configured to programmably shift the phase the second input clock.

6. The circuit of claim 5, wherein the phase shift is programmably shifted by a delay line having selectable taps, the selection of which by digital command determines the extent of the phase shift.

7. The circuit of claim 6, wherein the digital command is determined in response to phase differences between the first and the second input clock when the circuit for latching states is in a low voltage operating mode.

8. The circuit of claim 4, wherein the clock generator is configured to inhibit the second input clock during the first operating mode, and is configured to activate the second input clock in response to a low voltage enable signal that is arranged to place the circuit for latching states into the second operating mode.

9. A digital system, comprising:
a first and second dually clocked flip flop, each dually clocked flip flop having a primary latch arranged to latch a selected output signal in response to a composite clock signal, a secondary latch arranged to latch the selected output signal in response to a first clock signal, and a composite clock generator that is arranged to generate the composite clock signal in response to the first clock signal and a second clock signal;
a clock generator that is arranged to generate the first clock signal and the second clock signal, the second clock signal having a phase that is programmably shifted relative to the first clock signal; and
a dual clock tree that includes a first clock tree that is arranged to couple the first clock signal from the clock generator to a first clock input of each of the first and second dually clocked flip flops, and a second input clock tree that is arranged to couple the second clock signal from the clock generator to a second clock input of each of the first and second dually clocked flip flops.

10. The system of claim 9, wherein the secondary latch of the first dually clocked flip flop includes a secondary data output that is coupled to a primary data input of the primary latch of the second dually clocked flip flop.

11. The system of claim 9, wherein the clock generator is arranged to inhibit the second clock signal during a normal voltage operation mode and to activate the second clock signal during a low voltage operation mode.

12. The system of claim 10, wherein the first clock tree comprises less buffers than the second clock tree.

13. The system of claim 9, wherein the composite clock generator is configured to generate the composite clock signal as having a duty cycle that is the same as the duty cycle of the first input clock when the first and second dually clocked flip flops are operating at a first operating voltage, and to generate the composite clock signal as having a duty cycle that is determined in response to the first input clock and the second input clock when the first and second dually clocked flip flops are operating at second operating voltage that is lower than the first operating voltage.

14. The system of claim 9, wherein the composite clock generator is circuit configured to determine a negation of the result of a logical OR operation of the first and second clock signals.

15. The system of claim 9, wherein the clock generator is arranged to be programmed using a digital command to shift the phase of the second input clock relative to the first input clock.

16. A method for clocking latches in a system having two operating modes, comprising:
generating a first clock signal and a second clock signal, the second clock signal having a phase in a first operating mode, the phase being programmably shifted relative to the first clock signal when the system is operating in a second operating mode;
coupling the first and second clock signals to a first and second dually clocked flip flop, each having a primary latch and a secondary latch;
generating in each of the first and second dually clocked flip flop a composite clock signal in response to the first clock signal and the second clock signal; and
latching a selected input signal using the secondary latch of the first dually clocked flip flop in response to the first clock signal, and latching the output of the latched selected input signal using the primary latch of the second dually clocked flip flop in response to the composite clock signal.

17. The method of claim 16 wherein the first and second operation modes are determined in response to operating voltages or operating temperatures.

18. The method of claim 16, wherein digital command is determined by a phase variance of the propagation between branches of the first clock signal in the first clock tree when the system is operating at an operating voltage that is lower than a normal operating voltage of the system.

19. The method of claim 18, further comprising activating the second clock signal in response to lowering the operating voltage of the system.

* * * * *